(12) United States Patent
Endo et al.

(10) Patent No.: US 7,790,573 B2
(45) Date of Patent: Sep. 7, 2010

(54) PROCESS FOR PRODUCING SOI SUBSTRATE AND PROCESS FOR REGENERATION OF LAYER TRANSFERRED WAFER IN THE PRODUCTION

(75) Inventors: Akihiko Endo, Tokyo (JP); Toshiaki Ono, Tokyo (JP); Wataru Sugimura, Tokyo (JP)

(73) Assignee: Sumco Corporation, Tokyo (JP)

( * ) Notice: Subject to any disclaimer, the term of this patent is extended or adjusted under 35 U.S.C. 154(b) by 346 days.

(21) Appl. No.: 11/277,857

(22) Filed: Mar. 29, 2006

(65) Prior Publication Data
US 2006/0228846 A1 Oct. 12, 2006

(30) Foreign Application Priority Data
Apr. 7, 2005 (JP) .............................. 2005-110828

(51) Int. Cl.
*H01L 21/22* (2006.01)
(52) U.S. Cl. .................. 438/459; 438/149; 438/150; 438/455; 438/458; 438/479; 438/528
(58) Field of Classification Search ......... 438/149–150, 438/455, 458, 459, 479, 528
See application file for complete search history.

(56) References Cited

U.S. PATENT DOCUMENTS

| 7,084,046 B2 * | 8/2006 | Mitani et al. ................. 438/459 |
| 7,364,618 B2 * | 4/2008 | Hourai et al. .................. 117/20 |
| 2003/0170990 A1 * | 9/2003 | Sakaguchi et al. ........... 438/690 |
| 2005/0048738 A1 * | 3/2005 | Shaheen et al. ............. 438/458 |
| 2005/0064632 A1 | 3/2005 | Sakurada et al. |

(Continued)

FOREIGN PATENT DOCUMENTS

EP 2000-281491 A1 10/2000

(Continued)

OTHER PUBLICATIONS

English language Abstract of JP 05-211128.

(Continued)

*Primary Examiner*—Kevin M Picardat
*Assistant Examiner*—Bac H Au
(74) *Attorney, Agent, or Firm*—Greenblum & Bernstein, P.L.C.

(57) ABSTRACT

A process for producing an SOI substrate includes the steps of forming an oxide film on at least the front surface of a first silicon substrate, implanting hydrogen ion from the surface of the first silicon substrate and thereby forming an ion implantation area in the inside of the first silicon substrate, laminating a second silicon substrate onto the first silicon substrate via the oxide film and thereby forming a laminated body of the first silicon substrate and the second silicon substrate bonded with each other, and heating the laminated body at a predetermined temperature and thereby separating the first silicon substrate at the ion implantation area and thereby obtaining an SOI substrate wherein a thin film SOI layer is formed on the second silicon substrate via the oxide film. The first silicon substrate is formed by slicing an ingot free of an agglomerate of vacancy type point defects and an agglomerate of interstitial silicon type point defects grown by a CZ method in an inorganic atmosphere including hydrogen. The layer transferred wafer separated from the SOI layer is used again as the first silicon substrate.

5 Claims, 4 Drawing Sheets

U.S. PATENT DOCUMENTS

2006/0118935 A1* 6/2006 Kamiyama et al. .......... 257/684

FOREIGN PATENT DOCUMENTS

| EP | 1 156 531 A1 | 11/2001 |
| EP | 1 598 452 A1 | 11/2005 |
| JP | 05-211128 | 8/1993 |
| JP | 11-001393 | 1/1999 |
| JP | 2000-030995 | 1/2000 |
| JP | 2001-155978 | 6/2001 |
| KR | 10-2000-0011406 | 2/2000 |
| KR | 2000-0011406 | 2/2000 |
| WO | 2004/083496 A1 | 9/2004 |

OTHER PUBLICATIONS

English language Abstract of JP 2001-155978.
English language Abstract of JP 11-001393.
English language Abstract JP 2000-281491 A1.

* cited by examiner

PROCESS FOR PRODUCING SOI SUBSTRATE AND PROCESS FOR REGENERATION OF LAYER TRANSFERRED WAFER IN THE PRODUCTION

CROSS-REFERENCES TO RELATED APPLICATIONS

This application claims priority under 35 U.S.C. §119(d) to Japanese Application No. 2005-110828 filed Apr. 7, 2005, the entire disclosure of which is hereby incorporated by reference.

BACKGROUND OF THE INVENTION

1. Field of the Invention

The present invention relates to a process for producing an SOI (Silicon On Insulator) substrate in which an SOI layer is manufactured on an oxide film by use of hydrogen ion implantation technology. Additionally, the present invention relates to a process for the regeneration of a layer transferred wafer in the process for producing an SOI.

2. Description of the Related Art

Conventionally, a process for producing an SOI substrate has been known in which after an oxide film is formed on the surface of a first silicon substrate, hydrogen ions of a high concentration are implanted into the inside thereof, and an annealing process is performed at a high temperature. Additionally, a hydrogen ion implantation area is formed in a predetermined depth from this silicon substrate surface, then a second silicon substrate is laminated onto this first silicon substrate and a laminated body of the two substrates bonded with each other is formed, and this laminated body is heated up to a temperature over 500° C. and the first silicon substrate is separated from the second silicon substrate at the hydrogen ion implantation area, and thereby a semiconductor SOI layer is formed on the surface of the second silicon substrate. (For example, Japanese Unexamined Patent Application Publication No. 5-211128.) According to this method, it is possible to produce an SOI substrate having the second silicon substrate and the oxide film formed on this substrate and functioning as a buried oxide film and the semiconductor SOI layer formed on this oxide film.

Further, when an SOI substrate is produced by such a method as the above, because the first silicon substrate is separated at the hydrogen ion implantation area and the semiconductor SOI layer is formed on the surface of the second silicon substrate, a layer transferred wafer at the side where the first silicon substrate is separated and an SOI layer is not formed is by-produced inevitably. And according to this method for producing an SOI substrate, since this by-produced layer transferred wafer is regenerated and reused as a first silicon substrate once again and thereby a plurality of SOI substrates can be obtained, as a result, it is possible to reduce costs to a great extent. (For example, Japanese Unexamined Patent Application Publication No. 2001-155978.)

Herein, crystal defects of the SOI layer such as an OSF, a COP, an L/D and the like in the SOI layer of an SOI substrate deteriorate device characteristics, and so, it is necessary to reduce those crystal defects. Accordingly, it is desired that the first silicon substrate on which an SOI layer is formed by separation after ion implantation should be a wafer free of such crystal defects. Herein, "OSF" refers to an Oxidation Induced Stacking Fault, "COP" refers to a Crystal Originated Particle, and "L/D" refers to an Interstitial-type Large Dislocation. Specifically, micro defects to become nuclei of this OSF are introduced into a crystal at the growth of the crystal, and this OSF becomes obvious in a thermal oxidation process or the like in producing a semiconductor device and causes failures including increased leak current and the like of a manufactured device. Further, the COP is a pit arising from a crystal that occurs on a wafer surface when a silicon wafer after mirror polishing is cleaned with a mixed liquid of ammonia and hydrogen peroxide. When this wafer is measured with a particle counter, this pit as well as original particles are detected as light scattering defects. This COP causes the deterioration of electric characteristics such as, for example, a Time Dependent Dielectric Breakdown (TDDB) of an oxide film, and a Time Zero Dielectric Breakdown (TZDB) of an oxide film and the like. Further, if there is a COP on a wafer surface, a dump occurs in a device wiring process, leading to a wire disconnection. And in an element separation portion too, the COP causes a leak and the like, decreasing the yield of products. Further, the L/D is also called a dislocation cluster, or a dislocation pit because when a silicon wafer with this defect is dipped in a selective etching liquid made mainly of hydrofluoric acid, a pit is generated. This L/D also causes the deterioration of electric characteristics such as, for example leak characteristics, isolation characteristics and the like.

On the other hand, a defect-free silicon wafer not having such an OSF, COP and L/D is known. (For example, Japanese Unexamined Patent Application Publication No. 11-1393.) This defect-free silicon wafer is a silicon wafer cut out from an ingot made of a perfect area [P] which is a perfect area where there is not an agglomerate of vacancy type point defects and an agglomerate of interstitial silicon type point defects in a silicon single crystal ingot. The perfect area [P] exists between an area [I] where the interstitial silicon type point defects exist dominantly, and an area [V] where the vacancy type point defects exist dominantly in a silicon single crystal ingot. A silicon wafer made of this perfect area [P] is so prepared that when the pulling velocity of an ingot is defined as V (mm/minute), and the temperature gradient in the vertical direction of the ingot at the vicinity of the interface between a silicon melt and the ingot is defined as G (° C./mm), the value of V/G (mm$^2$/minute ° C.) should be determined in order that OSFs that occur in a ring shape at a thermal oxidation process should cease to exist at the central portion of the wafer. Accordingly, it is considered that by producing an SOI substrate with such a defect-free silicon wafer as a first silicon substrate, and reusing a layer transferred wafer by-produced at the production thereof as a first silicon substrate once again, a plurality of SOI substrates free of OSF, COP, and L/D in the SOI layer thereof can be obtained repeatedly.

However, when a wafer free of crystal defects sliced from an ingot not hydrogen doped is used as a first silicon substrate, there is a fear that oxygen existing in solid solution form in the first silicon substrate may become oxygen precipitates in plural times of heat treatment in the production process. Therefore, even if an SOI substrate is produced by use of a wafer free of crystal defects sliced from an ingot not hydrogen doped is used as a first silicon substrate, oxygen precipitates may occur in a layer transferred wafer by-produced at the production thereof, and so, oxygen precipitates may exist in an SOI substrate obtained by reusing the layer transferred wafer as a first silicon substrate, which has been a problem not solved yet in the prior art.

BRIEF SUMMARY OF THE INVENTION

Accordingly, the object of the present invention is to provide a process for producing an SOI substrate for preventing oxygen precipitates from occurring in an SOI substrate obtained by reusing a layer transferred wafer. Additionally, the object of the present invention is to provide a process for the regeneration of a layer transferred wafer in the production.

Figure 1:
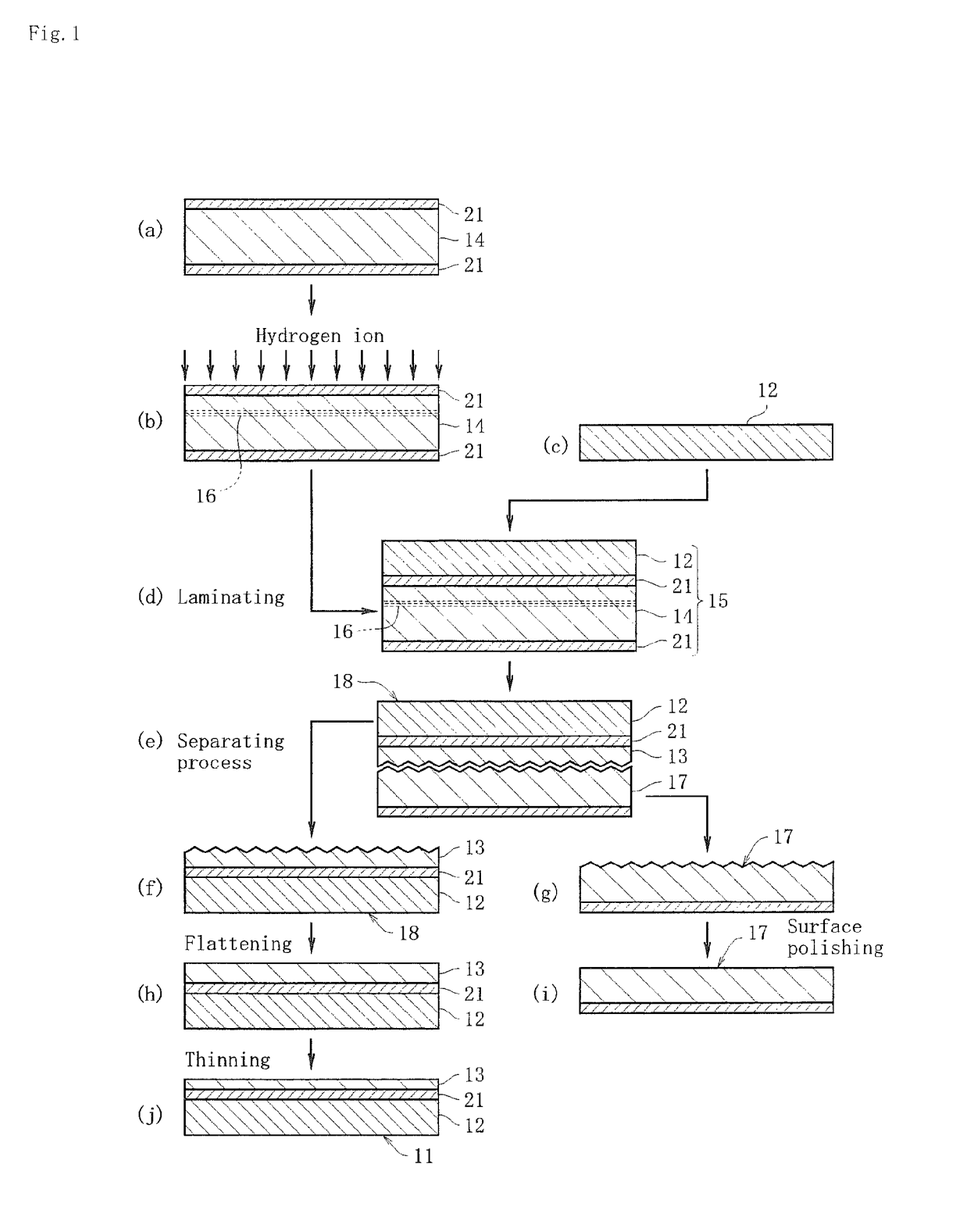
FIG. 1 is a figure showing a process for producing an SOI substrate according to a preferred embodiment of the present invention in process sequence.

According to a first embodiment of the present invention, there is provided an improved process for producing an SOI substrate, as shown in FIG. 1, including the steps of forming an oxide film 21 on at least the front surface of a first silicon substrate 14, implanting hydrogen ions from the surface of the first silicon substrate 14 and thereby forming an ion implantation area 16 in the inside of the first silicon substrate 14, laminating a second silicon substrate 12 onto the first silicon substrate 14 via the oxide film 21 and thereby forming a laminated body 15 of the first silicon substrate 14 and the second silicon substrate 12 bonded with each other, and heating the laminated body 15 at a predetermined temperature and thereby separating the first silicon substrate 14 at the ion implantation area 16 and thereby obtaining an SOI substrate 11 in which a thin film SOI layer 13 is formed on the second silicon substrate 12 via the oxide film 21.

The characteristic point is that the first silicon substrate 14 is formed by slicing an ingot free of an agglomerate of vacancy type point defects and an agglomerate of interstitial silicon type point defects grown by a Czachralski (CZ) method in an inorganic atmosphere including hydrogen.

In the process for producing an SOI substrate according to the first embodiment of the present invention, the ingot for preparing the first silicon substrate 14 is grown in an inorganic atmosphere including hydrogen, and the perfect area [P] thereof increases. It is possible to relatively easily obtain the first silicon substrate 14 free of an agglomerate of vacancy type point defects and an agglomerate of interstitial silicon type point defects, and so, it is possible to decrease the unit price of the obtained SOI substrate 11.

Further, a wafer free of an agglomerate of vacancy type point defects and an agglomerate of interstitial silicon type point defects is used as the first silicon substrate 14, and accordingly, solid solution oxygen that causes crystal defects of the SOI layer 13 hardly becomes oxygen precipitates in the heat treatment. Furthermore, in a hydrogen doped ingot, the COP size becomes smaller even in an area where COPs exist. COPs easily cease to exist in the heat treatment in a reduction atmosphere of the producing process of the SOI substrate. Moreover, by hydrogen doping, vacancy type point defects necessary for the generation and growth of oxygen precipitates are united with hydrogen and the substantial vacancy concentration decreases, and so, in comparison with a normal crystal, the generation probability of oxygen precipitates becomes further smaller. Accordingly, it is possible to prevent oxygen precipitates and COPs from occurring in the SOI layer 13 in the SOI substrate 11 obtained by this producing process and the SOI layer 13 in the SOI substrate 11 using a layer transferred wafer by-produced by this process as the first silicon substrate 14. The defect density in these SOI layers 13 decreases from that in the conventional one, and the crystal quality of the SOI layers 13 in these SOI substrates 11 can be improved further.

According to another feature of the present invention, the ingot to form the first silicon substrate 14 is so grown that the oxygen concentration is in the range of $5 \times 10^{17}$ to $14 \times 10^{17}$ atoms/cm$^3$ (Old-ASTM, same hereinafter).

In the process for producing an SOI substrate according to this feature, it is possible to sufficiently prevent oxygen precipitates from generating in the layer transferred wafer 17 in the state where the necessary mechanical strength of the layer transferred wafer 17 by-produced by this process. Herein, if the oxygen concentration of the first silicon substrate 14 is below $5 \times 10^{17}$ atoms/cm$^3$, because there is little interstitial oxygen, the wafer mechanical strength decreases, and slips occur easily by the heat treatment, and become crystal defects in products of the SOI substrate 11 and deteriorate the device characteristics. Further, if the oxygen concentration of the first silicon substrate 14 exceeds $14 \times 10^{17}$ atoms/cm$^3$, it becomes difficult to prevent oxygen precipitates from generating by the heat treatment. From the viewpoint of the mechanical strength and the prevention of oxygen precipitates, the further preferable oxygen concentration of the first silicon substrate 14 is in the range of $7 \times 10^{17}$ to $12 \times 10^{17}$ atoms/cm$^3$.

According to another embodiment of the present invention, there is provided a method for the regeneration of a layer transferred wafer in the process for producing of an SOI substrate according to the first embodiment of the present invention, in which the layer transferred wafer 17 separated from the SOI layer 13 by separating at the ion implantation area 16 is used again as the first silicon substrate 14.

In the process for the regeneration of a layer transferred wafer in the production of an SOI substrate according to this embodiment, the layer transferred wafer 17 is obtained by separating the first silicon substrate 14 formed by slicing an ingot free of an agglomerate of vacancy type point defects and an agglomerate of interstitial silicon type point defects. Accordingly, even in the obtained layer transferred wafer 17, in comparison with a normal crystal, the generation probability of oxygen precipitates becomes smaller. Further, by a crystal pulled up in an atmosphere including hydrogen, vacancy type point defects necessary for the generation and growth of oxygen precipitates are united with hydrogen and the substantial vacancy concentration decreases, and so, in comparison with a normal crystal, the generation probability of oxygen precipitates becomes further smaller. Accordingly, even when an SOI substrate is produced once again by using this layer transferred wafer 17 as the first silicon substrate 14, it is prevented crystal defects from occurring in the SOI layer in the obtained SOI substrate 11, and so, it is possible to increase the number of regeneration times than that in the case of a normal crystal without deteriorating the crystal quality of the obtained SOI layer 13.

In the process for producing an SOI substrate according to the present invention, because a first silicon substrate is formed by slicing an ingot free of an agglomerate of vacancy type point defects and an agglomerate of interstitial silicon type point defects grown by a CZ method in an inorganic atmosphere including hydrogen, the perfect area [P] of the ingot increases, and so, it is possible to relatively easily obtain a first silicon substrate free of the agglomerate of vacancy type point defects and the agglomerate of interstitial silicon type point defects. As a result, it is possible to decrease the unit price of the obtained SOI substrate 11. And, because a wafer free of an agglomerate of vacancy type point defects and an agglomerate of interstitial silicon type point defects is used as a first silicon substrate, and hydrogen is doped, vacancy type point defects necessary for the generation and growth of oxygen precipitates are united with hydrogen and the substantial vacancy concentration decreases. Thus, in comparison with a normal crystal, the generation probability of oxygen precipitates becomes further smaller. Accordingly, solid solution oxygen that causes crystal defects of the SOI layer hardly becomes oxygen precipitates in the heat treatment, and the COP size becomes smaller even in an area where COPs exist. Accordingly, it is possible to prevent COPs from occurring in the SOI layer in the SOI substrate 11 obtained by this producing process and the SOI layer in the SOI substrate using a layer transferred wafer by-produced by this producing process as a first silicon substrate, and to further improve the crystal quality of the SOI layers in these SOI substrates.

Further, in the process for regeneration of a layer transferred wafer in the production of an SOI substrate by the use of a layer transferred wafer separated from an SOI layer by separating at the ion implantation area in a process for producing an SOI substrate, even in an obtained layer transferred wafer, in comparison with a normal crystal, the generation probability of oxygen precipitates becomes smaller. Accordingly, even when an SOI substrate is produced once again by using this layer transferred wafer as a first silicon substrate, it is prevented crystal defects from occurring in the SOI layer in the obtained SOI substrate, and so, it is possible to increase the number of regeneration times than that in the case of a normal crystal without deteriorating the crystal quality of the obtained SOI layer.

DETAILED DESCRIPTION OF THE INVENTION

An aspect of a preferred embodiment according to the present invention is illustrated in more details with reference to the attached drawings hereinafter.

As shown in FIG. 1($j$), an SOI substrate 11 includes a second silicon substrate 12 made of a silicon single crystal, and an SOI layer 13 made of a silicon single crystal bonded via a first oxide film 21 to the second silicon substrate 12. The first oxide film 21 is a silicon oxide film ($SiO_2$ film) having insulation properties.

FIG. 1 shows an embodiment where the oxide film is not formed on the second silicon substrate 12. Alternatively, an oxide film may be formed separately on the second silicon substrate 12 though it is not illustrated in the figure.

A process for producing such an SOI substrate 11 according to the present invention is explained hereinafter.

First, a first silicon substrate 14 made of a silicon single crystal is prepared, and the first oxide film 21 made of a silicon oxide film ($SiO_2$ film) having insulation properties by thermal oxidization on the entire surfaces of not only the front surface but also the rear surface and side surfaces (not illustrated) of the first silicon substrate 14 is formed (FIG. 1($a$)). This first oxide film 21 is so formed as to have a thickness of 50 to 300 nm, preferably 100 to 200 nm. Herein, the thickness of the first oxide film 21 is limited to the range 50 to 300 nm, because if the thickness is below 50 nm, in bonding with the second silicon substrate 12 described later herein, the effect to eliminate voids by use of flowability of the oxide film at high temperatures becomes weak and as a result, voids are easy to occur, and if the thickness is over 300 nm, the evenness of a buried oxide film is deteriorated below the device requirements. Meanwhile, the first oxide film ($SiO_2$ film) may be formed on only the front surface of the first silicon substrate by a CVD method in the place of thermal oxidization.

Next, through the front surface of the first silicon substrate 14, hydrogen ions of a dose amount $4 \times 10^{16}$ atoms/cm$^2$ to $10 \times 10^{16}$ atoms/cm$^2$ are implanted at an acceleration energy 20 to 200 keV. Thereby, an ion implantation area 16 is formed in the inside of the first silicon substrate 14 (FIG. 1($b$)). Herein, the dose amount of hydrogen ion is limited to the range $4 \times 10^{16}$/cm$^2$ to $10 \times 10^{16}$/cm$^2$, because if the dose amount is below $4 \times 10^{16}$/cm$^2$, the first silicon substrate cannot be cut open in a first heat treatment, and if the dose amount is over $10 \times 10^{16}$/cm$^2$, a self separation of the front surface of the first silicon substrate 14 occurs at the implantation of hydrogen ion and particles are easy to occur. Further, the acceleration energy is limited to the range 20 to 200 keV, because if the acceleration energy is below 20 keV, the SOI layer 13 becomes too thin, and if the acceleration energy is over 200 keV, a special ion implantation device is required.

On the other hand, the second silicon substrate 12 made of a silicon single crystal having the same surface area as that of the first silicon substrate 14 is prepared (FIG. 1 ($c$)). To this second silicon substrate 12, the oxide film may not be formed. The first silicon substrate 14 is laminated via the first oxide film 21 onto the second silicon substrate 12 and a laminated body 15 is formed (FIG. 1($d$)). With regard to the formation of this laminated body 15, the first silicon substrate 14 is laminated onto the second silicon substrate 12 and the position thereof is adjusted, and a load toward the first silicon substrate 14 is worked onto the center of the second silicon substrate 12 laminated onto the first silicon substrate 14.

Thereafter, this laminated body 15 is held in a nitrogen atmosphere at 400 to 800° C., preferably at 450 to 600° C., for 1 to 30 minutes, preferably 10 to 30 minutes, and a first heat treatment is performed. Thereby, the first silicon substrate 14 cracks up at the ion implantation area 16 equivalent to the implantation peak position of the hydrogen ion, and separates into an upper thick portion 17 and a lower thin SOI layer 13 (FIG. 1($e$)). Then, the lower SOI layer 13 is attached firmly to the second silicon substrate 12 via the first oxide film 21, and a bonded substrate 18 is made.

Next, the bonded substrate 18 is flattened and made thin until the final film thickness thereof is obtained, by a general method. For example, the area where damages at the separation exist is removed by a CMP process or an oxidization treatment or the like, and a heat treatment for improving the bond strength is performed. Further, by a CMP process, and a high temperature heat treatment in an atmosphere of hydrogen, argon gas and the like, flattening is performed (FIG. 1($f$) and ($h$)), and then the bonded substrate is made thin by a CMP process or an oxidization treatment until a predetermined film thickness of the SOI layer 13 is obtained, and thereby an SOI substrate 11 is obtained (FIG. 1($j$)).

The characteristic point of the process for producing the SOI substrate 11 according to the present invention is that the first silicon substrate 14 is formed by slicing an ingot free of an agglomerate of vacancy type point defects and an agglomerate of interstitial silicon type point defects grown by a CZ method in an inorganic atmosphere including hydrogen so that the oxygen concentration of the ingot should be in the range of $5 \times 10^{17}$ to $14 \times 10^{17}$ atoms/cm$^3$. Namely, the ingot is pulled up from a silicon melt in a hot zone furnace by the CZ method in a predetermined pulling velocity profile based on Voronkov's theory. The Voronkov's theory is to control V/G (mm²/minute·° C.) when the pulling velocity of an ingot is defined as V (mm/minute), and the temperature gradient in the vertical direction of the ingot at the vicinity of the interface between a silicon melt and the ingot is defined as G (° C./mm), so as to grow a highly pure ingot with little defects.

Figure 2:
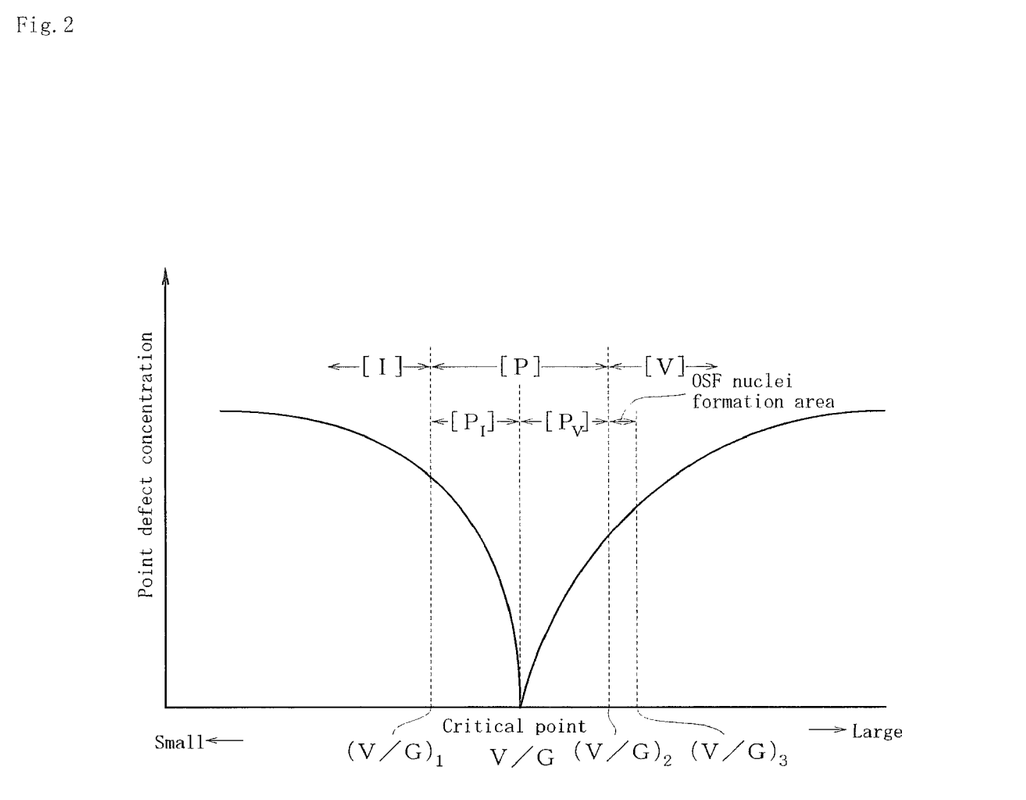
FIG. 2 is a figure showing the fact based on Voronkov's theory that when the V/G ratio is over the critical point, a vacancy-rich ingot is formed, and when the V/G ratio is below the critical point, a interstitial silicon-rich ingot is formed.

As shown in FIG. 2, according to Voronkov's theory, V/G is shown in the horizontal axis, and the vacancy type point defect concentration and the interstitial silicon type defect concentration are shown in the same vertical axis, and the relation of V/G and the point defect concentrations is expressed schematically. It is shown that the interface between the vacancy area and the interstitial silicon area is determined by V/G. In more details, when the V/G ratio is over the critical point, an ingot in which the vacancy type point defect concentration is dominant is formed, and when the V/G ratio is below the critical point, an ingot in which the interstitial silicon type point defect concentration is dominant is formed. FIG. 2, [I] shows the area (below $(V/G)_1$) where the interstitial silicon type point defects are dominant, and the interstitial silicon type point defects exist, and [V] shows the area (over$(V/G)_2$) where the vacancy type point defects are dominant in the ingot, and the vacancy type point defects exist, and [P] shows the perfect area ($(V/G)_1$ to $(V/G)_2$) where there is not any agglomerate of vacancy type point defects or any agglomerate of interstitial silicon type point defects. In the area [V] adjacent to the area [P], there is the area for forming an OSF nuclei [OSF] ($(V/G)_2$ to $(V/G)_3$).

This perfect area [P] is further divided into an area [$P_I$] and an area [$P_V$]. [$P_I$] is the area where the V/G ratio is in the range from the above $(V/G)_1$ to the critical point, and [$P_V$] is the area where the V/G ratio is in the range from the critical point to the above $(V/G)_2$. Namely, [$P_I$] is the area that is adjacent to [I] and includes the interstitial silicon type point defect concentration below the lowest interstitial silicon type point defect concentration at which an interstitial dislocation can be formed, and [$P_V$] is the area that is adjacent to [V] and includes the vacancy type point defect concentration below the lowest vacancy type point defect concentration at which an OSF can be formed.

Figure 3:
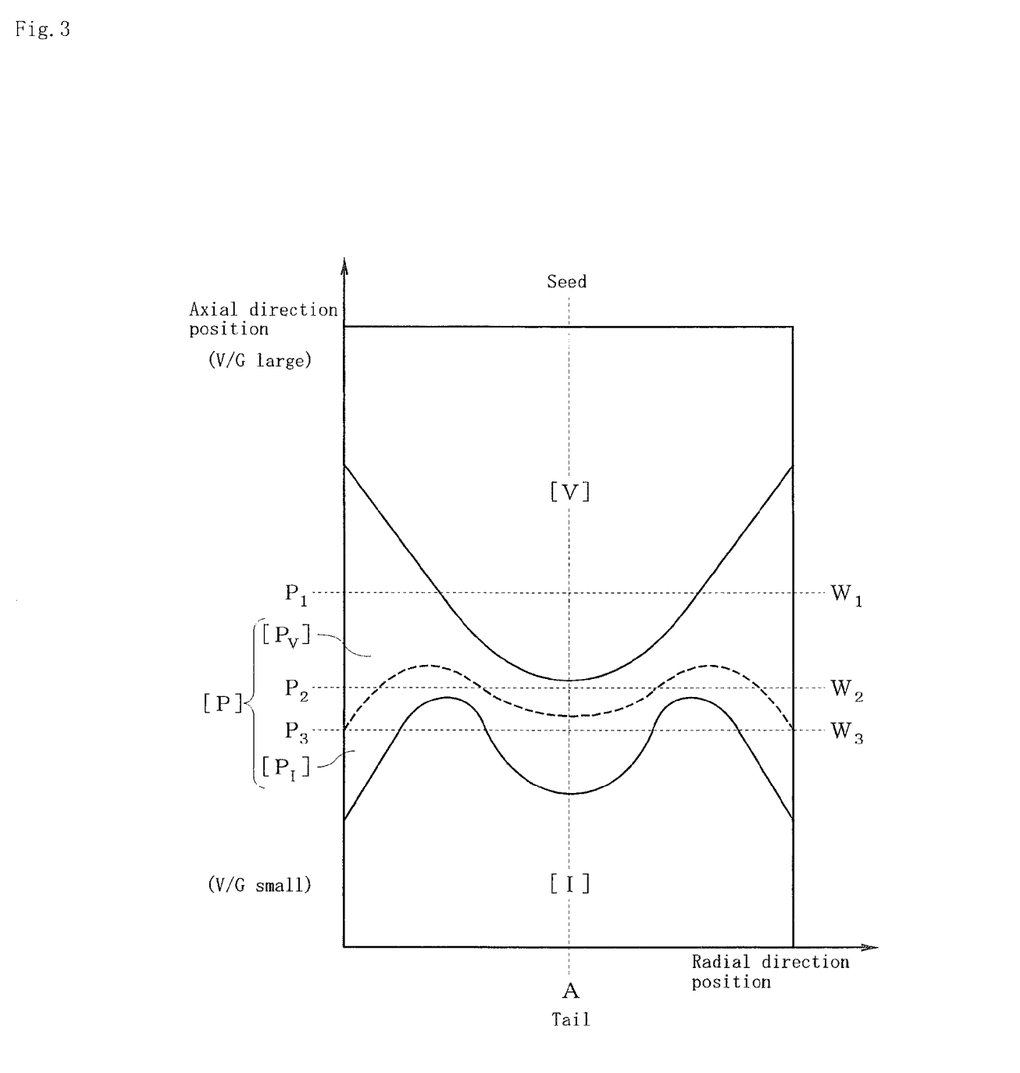
FIG. 3 is a schematic figure of an X-ray topography showing the area where vacancy exists dominantly, and the area where interstitial silicon exists dominantly, and the perfect area, in an ingot pulled up in an inorganic gas not including hydrogen.

On the other hand, a cross sectional view of an ingot when the pulling velocity is gradually decreased in a nitrogen atmosphere and the V/G is decreased continuously is shown in FIG. 3. In FIG. 3, the area where the vacancy type point defects exist dominantly in the ingot is shown as [V], and the area where the interstitial silicon type point defects exist dominantly is shown as [I], and the perfect area where there is not any agglomerate of vacancy type point defects or any agglomerate of interstitial silicon type point defects is shown as [P]. As described previously, the perfect area [P] is further divided into the area [$P_I$] and the area [$P_V$]. The area [$P_V$] is the area where vacancy type point defects that do not get into an agglomerate exist even in the perfect area [P], and the area [$P_I$] is the area where interstitial silicon type point defects that do not get into an agglomerate exist even in the perfect area [P].

As shown in FIG. 3, the position $P_1$ in the axial direction of the ingot includes the area where the vacancy type point defects exist dominantly at the center. The position $P_3$ includes the ring area where the interstitial silicon type point defects exist dominantly and the central perfect area. Further, the position $P_2$ has no agglomerate of vacancy type point defects at the center, or no agglomerate of interstitial silicon type point defects at the circumferential portion, and is entirely the perfect area. Accordingly, as is apparent from this FIG. 3, the wafer $W_1$ corresponding to the position $P_1$ includes the area where the vacancy type point defects exist dominantly at the center. The wafer $W_3$ corresponding to the position $P_3$ includes the ring area where the interstitial silicon type point defects exist dominantly and the central perfect area. Further, the wafer $W_2$ corresponding to the position $P_2$ includes no agglomerate of vacancy type point defects at the center, or no agglomerate of interstitial silicon type point defects at the circumferential portion, and is entirely the perfect area, and is the area where the area [$P_V$] and the area [$P_I$] exist in mixture.

Figure 4:
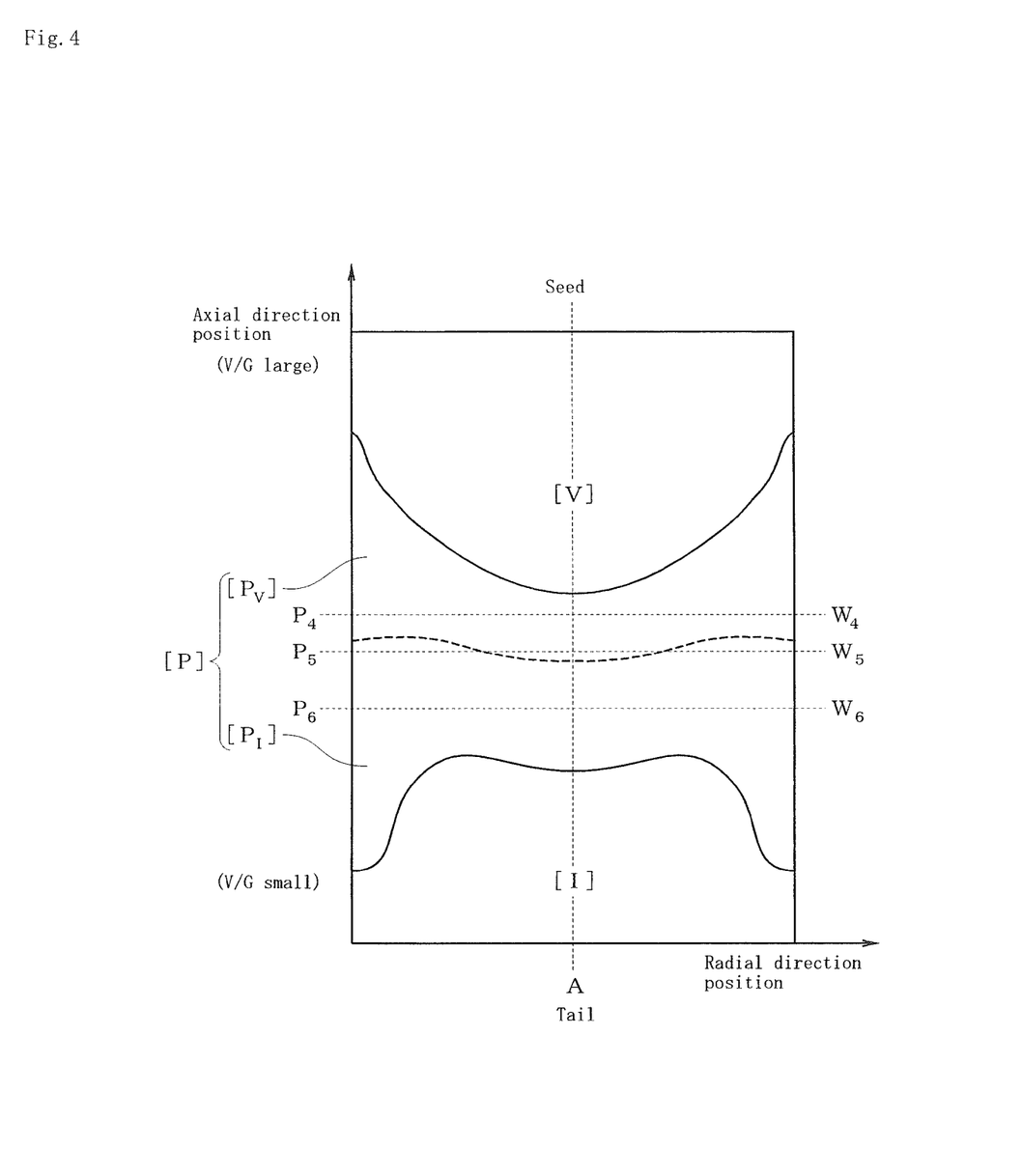
FIG. 4 is a schematic figure of an X-ray topography corresponding to FIG. 3 and showing the area where vacancy exists dominantly, and the area where interstitial silicon exists dominantly, and the perfect area, in an ingot pulled up in an inorganic gas including hydrogen.

On the other hand, in FIG. 4, a cross sectional view of an ingot when the pulling velocity is gradually decreased in an inorganic atmosphere including hydrogen and the V/G is decreased continuously is shown. The ingot in FIG. 4 shows a case in which a puller, after poly silicon of a raw material starts melting, until the ingot has been pulled up completely, hydrogen gas whose volume ratio to that of argon gas is 6% is mixed from the inlet port of argon gas and guided into the puller. And, the ingot from which the first silicon substrate 14 used in the producing process according to the present invention is cut out is limited to an ingot grown by the CZ method in an inorganic atmosphere including hydrogen. To the ingot grown by the CZ method in an inorganic atmosphere including hydrogen, hydrogen is doped, and as shown in FIG. 4, the perfect area [P], especially the area [$P_I$] where interstitial silicon type point defects that do not get into an agglomerate exist expands. This is considered because doped hydrogen is easy to unite with vacancy type point defects, and even with the same pulling conditions, the effective vacancy concentration decreases. And, as the ingot from which the first silicon substrate 14 used in the producing process according to the present invention is cut out, an ingot in the perfect area [P] is used. Herein, the ratio of hydrogen in the inorganic atmosphere is preferably 1 to 10 volume %, further preferably 3 to 10 volume %. If the ratio of hydrogen in the inorganic atmosphere is below 1 volume %, there occur problems such as the margin expansion of a defect-free area and the effect to prevent oxygen precipitates cannot be obtained, and if the ratio is over 10 volume %, there occur problems such as carbon members generally used at the moment of pulling up a silicon single crystal make an reaction with hydrogen, and it becomes difficult to pull up a crystal free of crystal defects.

In the process for producing the SOI substrate according to the present invention, a wafer obtained by slicing an ingot with an expanded perfect area [P] grown by the CZ method in an inorganic atmosphere including hydrogen is used as the first silicon substrate 14. Namely, the predetermined pulling velocity profile for obtaining the ingot for preparing the first silicon substrate 14 is so determined that when the ingot is pulled up from a silicon melt in the hot zone furnace, the ratio (V/G) of the pulling velocity to the temperature gradient shown in FIG. 2 should be maintained over the first critical ratio ($(V/G)_1$) for preventing the occurrence of the agglomerate of interstitial silicon type point defects, and below the second critical ratio ($(V/G)_2$) for restricting the agglomerate of vacancy type point defects within the area where vacancy type point defects exist dominantly at the center of the ingot. And as the first silicon substrate 14 used in the producing process according to the present invention cut out from the ingot, as shown in FIG. 4, one of a wafer $W_4$ where the area [$P_V$] corresponding to the position $P_4$ exists dominantly, a wafer $W_6$ where the area [$P_I$] corresponding to the position $P_6$ exists dominantly, and a wafer $W_5$ where [$P_V$] and the area [$P_I$] corresponding to the position $P_5$ exist in mixture is used.

Namely, in the process for producing the SOI substrate according to the present invention, the ingot for preparing the first silicon substrate 14 is grown in the inorganic atmosphere including hydrogen, thereby the perfect area [P] thereof expands, and accordingly, it is possible to relatively easily obtain the first silicon substrate 14 free of an agglomerate of vacancy type point defects and an agglomerate of interstitial silicon type point defects, and it is possible to reduce the unit price of the SOI substrate 11 to be obtained. Especially, the area [$P_I$] thereof expands, and the first silicon substrate 14 of the area [$P_I$] among the perfect areas is used, and accordingly, it is possible to securely reduce the unit price of the SOI substrate 11 to be obtained.

Further, in the process for producing the SOI substrate according to the present invention, a wafer free of an agglomerate of vacancy type point defects and an agglomerate of interstitial silicon type point defects is used as the first silicon substrate 14, solid solution oxygen that causes crystal defects of the SOI layer hardly becomes oxygen precipitates in the heat treatment. Further, in a hydrogen doped ingot, the COP size becomes smaller even in an area where COPs exist, and so, COPs easily ease to exist in the heat treatment in a reduction atmosphere of the producing process of the SOI substrate. Moreover, vacancy type defects necessary for the generation and growth of oxygen precipitates are united with hydrogen and the substantial vacancy concentration decreases, and so, in comparison with a normal crystal, the generation probability of oxygen precipitates becomes further smaller. Accordingly, it is possible to reduce the defect density of the SOI layer more than in the prior art, and further improve the crystal quality of the SOI layer. And, by using a wafer of the area [$P_I$] as the first silicon substrate 14, it is possible to further decrease the vacancy concentration and thereby further improve the quality thereof.

Next, a process for the regeneration of a layer transferred wafer in the production of an SOI substrate according to the present invention is explained hereinafter.

As shown in FIG. 1, this regeneration process is a process in which a layer transferred wafer separated from the SOI layer 13 by separation at the ion implantation area 16 in the above process for producing an SOI substrate is reused as a first silicon substrate 14. Specifically, after the separated surface from the SOI layer 13 is polished (FIG. 1 (g) and (i)), this layer transferred wafer 17 is used once again as a first silicon substrate 14. Herein, as the polishing process on the separated surface of the layer transferred wafer 17, at least normal mirror polishing or a combination of edge polishing around the substrate and mirror polishing is preferable. The polishing amount of the mirror polishing is 0.5 μm or higher to 10 μm or below, further preferably 1 μm or higher to 5 μm or below. If the polishing amount is below 0.5 μm, it is difficult to completely flatten concaves and convexes of the separated surface to a mirror finished level, and if it is 10 μm or higher, the flatness of the entire substrate is deteriorated.

In such a process for the regeneration of a layer transferred wafer in the production of an SOI substrate, by separating the first silicon substrate 14 formed by slicing an ingot free of an agglomerate of vacancy type point defects and an agglomerate of interstitial silicon type point defects, the layer transferred wafer 17 is obtained. Herein, the first silicon substrate 14 is made of the area free of an agglomerate of vacancy type point defects and an agglomerate of interstitial silicon type point defects, and when it is made of the area [$P_I$], where there are much interstitial silicon, solid solution oxygen that causes crystal defects of the SOI layer hardly becomes oxygen precipitates in the heat treatment. Thereby, in the layer transferred wafer 17 too, in comparison with a normal crystal, the generation probability of oxygen precipitates becomes smaller, and accordingly, it is possible to increase the number of regeneration times than that in the case of a normal crystal without deteriorating the crystal quality of the SOI layer.

Furthermore, vacancies necessary for oxygen deposition are further prevented from depositing by the hydrogen doping effect, and so, it is possible to reduce the costs.

On the other hand, even if the first silicon substrate 14 is made of the area [$P_V$], in comparison with a normal crystal, by the hydrogen doping effect, deposition is restricted, and it is possible to increase the number of regeneration times, and it is possible to reduce the costs.

Especially, the oxygen concentration of the first silicon substrate 14 is in the range of $5 \times 10^{17}$ to $14 \times 10^{17}$ atoms/cm³, it is possible to sufficiently prevent oxygen precipitates from occurring in the state where the necessary mechanical strength of the layer transferred wafer 17 is maintained. Herein, if the oxygen concentration of the first silicon substrate 14 is below $5 \times 10^{17}$ atoms/cm³, because there is little interstitial oxygen, the wafer mechanical strength decreases, and slips occur easily by the heat treatment, and become crystal defects in products of the SOI substrate 11 and deteriorate the device characteristics. Further, if the oxygen concentration of the first silicon substrate 14 exceeds $14 \times 10^{17}$ atoms/cm³, it becomes difficult to prevent oxygen precipitates from generating by the heat treatment.

EXAMPLE

Next, examples of the present invention are explained in more details with comparative examples hereinafter.

Example 1

A boron (B) doped p-type silicon ingot of a diameter 8 inch was pulled up by the CZ method in an inorganic atmosphere including hydrogen by use of a silicon single crystal puller. Into the inside of the puller, argon gas was flown at the flow amount 40 litters/minute, from the moment of heating the raw material to the moment of cooling the raw material. After poly silicon of the raw material started melting, until the ingot was pulled up completely, hydrogen gas whose volume ratio to that of argon gas was 6% was mixed from the inlet port of argon gas and guided into the puller. With regard to the ingot pulled up, the resistance ratio is approximately 10 Ωcm, and the oxygen concentration is $5 \times 10^{17}$ atoms/cm³. Two ingots were grown under the same conditions, while the V/G at the pulling moment was continuously decreased from 0.24 mm²/minute·° C. to 0.18 mm²/minute·° C. With regard to one ingot among the two ingots, the ingot center was cut in the pulling direction as shown in FIG. 4, and the positions of the respective areas were checked, and with regard to the other, a silicon wafer $W_4$ at the position corresponding to the $P_4$ in FIG. 4, and a first silicon substrate 14 whose outer diameter and thickness were 200 mm and 725 μm was obtained. That is, a first silicon substrate 14 in this example is wafer $W_4$ which the area [$P_I$] exists dominantly.

Next, a boron (B) doped p-type silicon ingot of a diameter 8 inch was pulled up by the CZ method in an inorganic atmosphere not including hydrogen by use of a silicon single crystal puller. Into the inside of the puller, argon gas was flown at the flow amount 40 liters/minute, from the moment of heating the raw material to the moment of pulling the raw material completely. With regard to the ingot pulled up, the length of the straight body portion is 1200 mm, the resistance ratio is approximately 10 Ωcm, and the oxygen concentration is $5 \times 10^{17}$ atoms/cm³. The V/G at the pulling moment was 0.24 mm²/minute·° C. The ingot was cut, and a silicon wafer is cut out, and a second silicon substrate 14 whose outer diameter and thickness were 200 mm and 725 μm was obtained.

As shown in FIG. 1, the firstly obtained first silicon substrate 14 was heated at 1000° C. for five hours in an oxygen atmosphere, and a first oxide film 21 was formed on not only the front surface but also the rear surface and the side surfaces of the first silicon substrate 14 (FIG. 1 (a)). Next, from the front surface of the first silicon substrate 14, hydrogen ion of a dose amount $6 \times 10^{16}/cm^2$ was implanted at an acceleration energy 50 keV, and thereby, an ion implantation area 16 was formed in the inside of the first silicon substrate 14 (FIG. 1(b)). Next, a separately prepared second silicon substrate 12 (FIG. 1(c)) was laminated via the first oxide film 21 onto the first silicon substrate 14 and thereby a laminated body 15 was obtained (FIG. 1(d)).

Next, this laminated body 15 was held in a nitrogen atmosphere at 500° C., for 30 minutes, and a heat treatment was performed, and the first silicon substrate was cracked up at the ion implantation area 16, and the upper SOI layer 13 was attached firmly to the second silicon substrate 12 via the first oxide film 21, and thereby a bonded substrate 18 was obtained (FIG. 1(f)). The area where damages at the separation existed of the bonded substrate 18 was removed by an oxidization treatment, and a high temperature heat treatment in an argon gas atmosphere for improving the bond strength was performed. Thereafter, the front surface of the bonded substrate was made flat, and by a heat treatment in an oxidization treatment, the bonded substrate was made thin until a predetermined film thickness of the SOI layer is obtained, and thereby an SOI substrate 11 is obtained (FIG. 1(j)). The SOI substrate 11 obtained thus was made as Example 1.

Example 2

With regard to the layer transferred wafer (FIG. 1(g)) obtained by performing the heat treatment onto the laminated body 15 and cutting the same at the ion implantation area 16 in Example 1, the separated surface from the SOI layer 13 was polished (FIG. 1(i)). The layer transferred wafer 17 where this separated surface was polished was used once again as a first silicon substrate 14, and by the same conditions and procedures as those in Example 1, an SOI substrate 11 was obtained again. This SOI substrate 11 obtained once again was made as Example 2.

Example 3

With regard to the layer transferred wafer (FIG. 1(g)) obtained by performing the heat treatment onto the laminated body 15 and cutting the same at the ion implantation area 16 in Example 2, the separated surface from the SOI layer 13 was polished (FIG. 1(i)). The layer transferred wafer 17 where this separated surface was polished was used once again as a first silicon substrate 14, and by the same conditions and procedures as those in Example 1, a third SOI substrate 11 was obtained. This SOI substrate 11 obtained thirdly was made as Example 3.

Example 4

With regard to the layer transferred wafer 17 (FIG. 1(g)) obtained by performing the heat treatment onto the laminated body 15 and cutting the same at the ion implantation area 16 in Example 3, the separated surface from the SOI layer 13 was polished (FIG. 1(i)). The layer transferred wafer 17 where this separated surface was polished was used once again as a first silicon substrate 14, and by the same conditions and procedures as those in Example 1, a fourth SOI substrate 11 was obtained. This SOI substrate 11 obtained fourthly was made as Example 4.

Example 5

The first silicon substrate 14 in this Example 5 is a wafer whose outer diameter and thickness are 200 mm and 725 μm, obtained by cutting a silicon wafer $W_6$ at the position corresponding to the $P_6$ in FIG. 4, as one of the two pulled up by the CZ method in an inorganic atmosphere including hydrogen by use of the silicon single crystal puller of Example 1. Namely, as the first silicon substrate 14 in this Example, a wafer $W_6$ where the area $[P_I]$ exists dominantly. And except that this wafer $W_6$ where the area $[P_I]$ exists dominantly is used as the first silicon substrate 14, by the same conditions and procedures as those in Example 1, an SOI substrate 11 was obtained again. This SOI substrate 11 obtained thus was made as Example 5.

Example 6

With regard to the layer transferred wafer 17 (FIG. 1(g)) obtained by performing the heat treatment onto the laminated body 15 and cutting the same at the ion implantation area 16 in Example 5, the separated surface from the SOI layer 13 was polished (FIG. 1(i)). The layer transferred wafer 17 where this separated surface was polished was used once again as a first silicon substrate 14, and by the same conditions and procedures as those in Example 5, an SOI substrate 11 was obtained again. This SOI substrate 11 obtained once again was made as Example 6.

Example 7

With regard to the layer transferred wafer 17 (FIG. 1(g)) obtained by performing the heat treatment onto the laminated body 15 and cutting the same at the ion implantation area 16 in Example 6, the separated surface from the SOI layer 13 was polished (FIG. 1(i)). The layer transferred wafer 17 where this separated surface was polished was used once again as a first silicon substrate 14, and by the same conditions and procedures as those in Example 5, a third SOI substrate 11 was obtained. This SOI substrate 11 obtained thirdly was made as Example 7.

Example 8

With regard to the layer transferred wafer 17 (FIG. 1(g)) obtained by performing the heat treatment onto the laminated body 15 and cutting the same at the ion implantation area 16 in Example 7, the separated surface from the SOI layer 13 was polished (FIG. 1(i)). The layer transferred wafer 17 where this separated surface was polished was used once again as a first silicon substrate 14, and by the same conditions and procedures as those in Example 5, a fourth SOI substrate 11 was obtained. This SOI substrate 11 obtained fourthly was made as Example 8.

Example 9

The first silicon substrate 14 in this Example 9 is a wafer whose outer diameter and thickness are 200 mm and 725 μm, obtained by cutting a silicon wafer $W_5$ at the position corresponding to the $P_5$ in FIG. 4, as one of the two pulled up by the CZ method in an inorganic atmosphere including hydrogen by use of the silicon single crystal puller of Example 1. Namely, as this first silicon substrate 14 in this Example, a wafer $W_5$ where the area $[P_I]$ and the area $[P_V]$ exist in mixture. And except that this wafer $W_5$ where the area $[P_I]$ and the area $[P_V]$ exist in mixture is used as the first silicon substrate 14, by the same conditions and procedures as those in Example 1, an SOI substrate 11 was obtained again. This SOI substrate 11 obtained thus was made as Example 9.

Example 10

With regard to the layer transferred wafer 17 (FIG. 1(g)) obtained by performing the heat treatment onto the laminated body 15 and cutting the same at the ion implantation area 16 in Example 9, the separated surface from the SOI layer 13 was polished (FIG. 1(i)). The layer transferred wafer 17 where this separated surface was polished was used once again as a first silicon substrate 14, and by the same conditions and procedures as those in Example 9, an SOI substrate 11 was obtained again. This SOI substrate 11 obtained once again was made as Example 10.

Example 11

With regard to the layer transferred wafer 17 (FIG. 1(g)) obtained by performing the heat treatment onto the laminated body 15 and cutting the same at the ion implantation area 16 in Example 10, the separated surface from the SOI layer 13 was polished (FIG. 1(i)). The layer transferred wafer 17 where this separated surface was polished was used once again as a first silicon substrate 14, and by the same conditions and procedures as those in Example 9, a third SOI substrate 11 was obtained. This SOI substrate 11 obtained thirdly was made as Example 11.

Example 12

With regard to the layer transferred wafer 17 (FIG. 1(g)) obtained by performing the heat treatment onto the laminated body 15 and cutting the same at the ion implantation area 16 in Example 11, the separated surface from the SOI layer 13 was polished (FIG. 1(i)). The layer transferred wafer 17 where this separated surface was polished was used once again as a first silicon substrate 14, and by the same conditions and procedures as those in Example 9, a fourth SOI substrate 11 was obtained. This SOI substrate 11 obtained fourthly was made as Example 12.

Comparative Example 1

A boron (B) doped p-type silicon ingot of a diameter 8 inch was pulled up by the CZ method in an inorganic atmosphere not including hydrogen by use of a silicon single crystal puller. Into the inside of the puller, argon gas was flown at the flow amount 40 liters/minute, from the moment of heating the raw material to the moment of pulling the raw material completely. With regard to the ingot pulled up, the length of the straight body portion is 1200 mm, the resistance ratio is approximately 10 Ωcm, and the oxygen concentration is $5 \times 10^{17}$ atoms/cm$^3$. Two ingots were grown under the same conditions, while the V/G at the pulling moment was continuously decreased from 0.24 mm$^2$/minute·° C. to 0.18 mm$^2$/minute·° C. With regard to one ingot among the two ingots, the ingot center was cut in the pulling direction as shown in FIG. 3, and the positions of the respective areas were checked, and with regard to the other, a silicon wafer $W_2$ at the position corresponding to the $P_2$ in FIG. 3, and a first silicon wafer $W_4$ whose outer diameter and thickness were 200 mm and 725 µm was obtained. Namely, the first silicon substrate 14 in this Comparative Example is a wafer $W_2$ having the area $[P_V]$ at the central portion and further the area $[P_I]$ around the central portion.

Except that as the first silicon substrate 14, a wafer where the area $[P_V]$ and the area $[P_I]$ exist in mixture, generated by slicing an ingot grown by the CZ method in an inorganic atmosphere not including hydrogen was used as the first silicon substrate 14, by the same conditions and procedures as those in Example 1, a third SOI substrate 11 was obtained. This SOI substrate 11 obtained thus was made as Comparative Example 1.

Comparative Example 2

With regard to the layer transferred wafer 17 (FIG. 1(g)) obtained by performing the heat treatment onto the laminated body 15 and cutting the same at the ion implantation area 16 in Comparative Example 1, the separated surface from the SOI layer 13 was polished (FIG. 1(i)). The layer transferred wafer 17 where this separated surface was polished was used once again as a first silicon substrate 14, and by the same conditions and procedures as those in Comparative Example 1, an SOI substrate 11 was obtained once again. This SOI substrate 11 obtained once again was made as Comparative Example 2.

Comparative Example 3

With regard to the layer transferred wafer 17 (FIG. 1(g)) obtained by performing the heat treatment onto the laminated body 15 and cutting the same at the ion implantation area 16 in Comparative Example 2, the separated surface from the SOI layer 13 was polished (FIG. 1(i)). The layer transferred wafer 17 where this separated surface was polished was used once again as a first silicon substrate 14, and by the same conditions and procedures as those in Comparative Example 1, a third SOI substrate 11 was obtained. This SOI substrate 11 obtained thirdly was made as Comparative Example 3.

Meanwhile, the agglomerate of vacancy type point defects (COP) and the area of interstitial silicon type point defects (dislocation cluster) and the presence or absence thereof were confirmed by use of the DSOD (Direct Surface Oxide Defect) method and the Cu decoration method respectively. A substrate free of the agglomerate of vacancy type point defects (COP) and the area of interstitial silicon type point defects (dislocation cluster) expressed herein means one in which any collective area in which defects observed by the above evaluation method have peculiar shapes such as a disk shape or a ring shape or the like is not to be observed.

Comparative Test and Evaluation

The density of HF defects in respective SOI layers in the SOI substrates in Examples 1 to 12 and Comparative Examples 1 to 3 was measured. HF defect evaluation is a general method for evaluate the crystal defects (COP, precipitates) of the SOI layer, and after an SOI substrate was dipped in an HF concentration 50% solution for 30 minutes, the number of defects was counted in the area excluding 5 mm at the external circumference of the substrate by use of an optical microscope. The result is shown in Table 1.

TABLE 1

| | Presence or absence of hydrogen doping and area of SOI layer | Number of reuse times | HF defect density (pieces/cm$^2$) |
|---|---|---|---|
| Example 1 | Present $[P_V]$ | 0 | 0.1 |
| Example 2 | Present $[P_V]$ | 1 | 0.2 |

TABLE 1-continued

| | Presence or absence of hydrogen doping and area of SOI layer | Number of reuse times | HF defect density (pieces/cm$^2$) |
|---|---|---|---|
| Example 3 | Present [P$_V$] | 2 | 0.2 |
| Example 4 | Present [P$_V$] | 3 | 0.3 |
| Example 5 | Present [P$_I$] | 0 | 0.05 |
| Example 6 | Present [P$_I$] | 1 | 0.05 |
| Example 7 | Present [P$_I$] | 2 | 0.05 |
| Example 8 | Present [P$_I$] | 3 | 0.05 |
| Example 9 | Present [P$_V$] and [P$_I$] | 0 | 0.1 |
| Example 10 | Present [P$_V$] and [P$_I$] | 1 | 0.15 |
| Example 11 | Present [P$_V$] and [P$_I$] | 2 | 0.2 |
| Example 12 | Present [P$_V$] and [P$_I$] | 3 | 0.2 |
| Comparative Example 1 | Absent [P$_V$] and [P$_I$] | 0 | 0.1 |
| Comparative Example 2 | Absent [P$_V$] and [P$_I$] | 1 | 2.5 |
| Comparative Example 3 | Absent [P$_V$] and [P$_I$] | 2 | 5.4 |

As is apparent from the result shown in Table 1, it is known that in the SOI substrates in Examples 1 to 12 in which ingots for preparing the first silicon substrate 14 were grown in an inorganic atmosphere including hydrogen, the HF defect density of the SOI layers thereof shows each a low value. On the other hand, in Comparative Example 1 where the ingot for preparing the first silicon substrate 14 was grown in an inorganic atmosphere not including hydrogen, the HF defect density of the SOI layer thereof shows a low value, however, in the SOI substrates in Comparative Examples 2 and 3 in which layer transferred wafers by-produced in the producing process thereof were reused as the first silicon substrate 14, the HF defect density of the SOI layers thereof shows an extremely high value. It is considered that this arises from the fact that the first silicon substrate 14 in the Comparative Examples was made of the ingots grown in an inorganic atmosphere not including hydrogen, and the solid solution oxygen included in the first silicon substrate 14 became precipitates in plural heat treatments in the producing process. Therefore, it is known that the present invention in which by forming the first silicon substrate by slicing an ingot grown in an inorganic atmosphere including hydrogen, oxygen precipitates are prevented from being formed in a layer transferred wafer and the layer transferred wafer are reused for plural times is effectively advantageous.

What is claimed is:

1. A process for producing an SOI substrate comprising the steps of:
   forming an oxide film on at least the front surface of a first silicon substrate; implanting hydrogen ions through the surface of the first silicon substrate and thereby forming an ion implantation area on the inside of the first silicon substrate;
   laminating a second silicon substrate onto the first silicon substrate via the oxide film and thereby forming a laminated body of the first silicon substrate and the second silicon substrate bonded with each other; and heating the laminated body at a predetermined temperature and thereby separating the first silicon substrate at the ion implantation area and thereby obtaining an SOI substrate in which a thin film SOI layer is formed on the second silicon substrate via the oxide film;
   wherein the first silicon substrate is formed by slicing an ingot grown by a CZ method in an inorganic atmosphere including hydrogen, the ingot is made of an area [P$_I$] which is the area where interstitial silicon type point defects that do not get into an agglomerate exist in a perfect area [P], which is the area where there are not any agglomerate of vacancy type point defects or any agglomerate of interstitial silicon type point defects.

2. The process according to claim 1, wherein the ingot to form the first silicon substrate has an oxygen concentration in the range of $5\times10^{17}$ to $14\times10^{17}$ atoms/cm$^3$.

3. A process for the regeneration of a layer transferred wafer in the production of an SOI substrate according to claim 1, wherein the layer transferred wafer separated from the SOI layer by separating at the ion implantation area is used again as a first silicon substrate.

4. The process according to claim 1, wherein the amount of hydrogen in the inorganic atmosphere is 1 to 10 volume %.

5. The process according to claim 4, wherein the amount of hydrogen in the inorganic atmosphere is 3 to 10 volume %.

* * * * *

UNITED STATES PATENT AND TRADEMARK OFFICE
CERTIFICATE OF CORRECTION

PATENT NO. : 7,790,573 B2
APPLICATION NO. : 11/277857
DATED : September 7, 2010
INVENTOR(S) : A. Endo et al.

Page 1 of 1

It is certified that error appears in the above-identified patent and that said Letters Patent is hereby corrected as shown below:

Title Page, Item (56) Foreign Patent Documents, please replace "EP    2000-281491 A1    10/2000" with --JP    2000-281491 A1    10/2000--.

Signed and Sealed this
Nineteenth Day of April, 2011

David J. Kappos
*Director of the United States Patent and Trademark Office*